(12) United States Patent
Sun et al.

(10) Patent No.: US 7,755,282 B2
(45) Date of Patent: Jul. 13, 2010

(54) LED STRUCTURE AND FABRICATING METHOD FOR THE SAME

(75) Inventors: Tsung-Ting Sun, Chung-Ho (TW);
Hung-Ta Laio, Chung-Ho (TW);
Hung-Hsun Chou, Chung-Ho (TW);
Kuo-Shih Hsu, Chung-Ho (TW);
Pao-Shen Chen, Chung-Ho (TW)

(73) Assignee: Edison Opto Corporation, Taipei (TW)

( * ) Notice: Subject to any disclaimer, the term of this patent is extended or adjusted under 35 U.S.C. 154(b) by 739 days.

(21) Appl. No.: 11/383,193

(22) Filed: May 12, 2006

(65) Prior Publication Data

US 2007/0262713 A1    Nov. 15, 2007

(51) Int. Cl.
*H01J 1/62* (2006.01)
*H01J 63/04* (2006.01)

(52) U.S. Cl. .................. 313/512; 313/498; 313/506

(58) Field of Classification Search ......... 313/498–512; 257/98–100
See application file for complete search history.

(56) References Cited

U.S. PATENT DOCUMENTS

| 7,221,003 | B2 * | 5/2007 | Ueno et al. ............... 257/98 |
| 7,345,317 | B2 * | 3/2008 | Reeh et al. ............... 257/98 |
| 2002/0063301 | A1 * | 5/2002 | Hanamoto et al. .......... 257/432 |
| 2004/0061433 | A1 * | 4/2004 | Izuno et al. ............... 313/498 |
| 2005/0133808 | A1 * | 6/2005 | Uraya et al. ............... 257/99 |
| 2005/0162069 | A1 * | 7/2005 | Ota et al. ................. 313/501 |
| 2006/0186431 | A1 * | 8/2006 | Miki et al. ............... 257/100 |

FOREIGN PATENT DOCUMENTS

WO    WO 2006006544 A1 *   1/2006

* cited by examiner

*Primary Examiner*—Joseph L Williams
*Assistant Examiner*—Kevin Quarterman
(74) *Attorney, Agent, or Firm*—Chun-Ming Shih; HDLS IPR Services

(57) ABSTRACT

A method is performed for the fabrication of LED and its structure. The LED is capable of emitting uniform white light and includes a substrate, an LED die, a holding frame and fluorescent substance where the holding frame is of hollow shape. The LED contains a die emitting blue light, and the fluorescent substance is a yellow phosphor. As the LED die is mounted on the substrate, the holding frame is seated on the die, and a bond wiring is performed. The holding frame is filled with the fluorescent substance in a uniform distribution on the die to form a layer of fluorescence. Finally the structure of the LED is accomplished as the packaging is completed.

8 Claims, 6 Drawing Sheets

LED STRUCTURE AND FABRICATING METHOD FOR THE SAME

BACKGROUND OF THE INVENTION

1. Field of the Invention

The present invention relates to a light emitting diode (LED) and more particularly to a method for fabricating the LED and the structure thereof.

2. Description of the Prior Art

LED is a solid-state semiconductor device, which makes use of the recombination of two charged carriers by electrical current flowing through a diode, to release energy in the form of light, featuring advantages of compact in size, fast response, and high efficiency. Therefore LED has versatile applications to a variety of industries.

Due to its compact size, LED can be used for various applications. For example, the LED has gained great popularity for lighting application. Moreover, the demand for white LED has been substantially boosted. White light is produced by blending multiple colors in the visual spectrum. The white light visible to the human eyes is formed by mixing at least two colors of different wavelengths in appropriate intensities, for instance: tri-wavelength white light blended by red, green and blue colors, or bi-wavelength white light blended by blue and yellow colors.

There are two most common techniques in obtaining white LED by mixing blue and yellow lights. The first method is to place a blue LED die and a yellow LED die together to mix uniform white light by proper control of electrical current through each LED die. Even though the technique has good luminescent efficiency, the difference in current control and variations in decay rate of dies surely deteriorate the luminescent efficiency of the LED. The other art is based on the emission of blue light which excites the yellow phosphor to emit yellow light, resulting apparent white light via mixing blue and yellow light. Due to ease in production and low cost, a majority of white LED manufacturers adopt this approach. Conventional method of generating white light from the blue light to excite yellow phosphor incorporates the phosphor with a packaging substrate in the package of LED die. The above mention method is strictly depended on high specific weight of phosphor, the uniformity of phosphor will affect the efficiency of excited the phosphor. An extra diffusion layer can be coated outside the package substrate, therefore, the refraction of micro transparent particles or bubbles spreading in the diffusion layer can uniform the blended light. However, materials of the micro transparent particles or bubbles and distribution densities of the particles should be carefully matched. Therefore, there are unexpected factors embedded in the foregoing art, and great difficulties are surely found once in carrying out the manufacturing.

SUMMARY OF THE INVENTION

In the light of the foregoing drawbacks, the present invention is to provide an LED fabrication method and its structure that is able to produce uniform white light. The realization of the method and its structure is by laying a hollow holding frame on top of an LED die, filling the holding frame with yellow fluorescent substance and making the substance uniformly cover the die. Once blue light emitted by the die excites the yellow fluorescent substance, a uniform white light can then be produced. This approach can not only enhance the uniformity of light and avoid dispersion, but also improve accuracy and precision during its fabrication process.

The LED fabrication method and its structure according to the present invention comprises: a substrate, an LED die, a holding frame and fluorescent substance where the holding frame is of a hollow shape. The structure of the LED is accomplished by a series of processes as in the following: firstly by mounting the LED die on the substrate, laying the holding frame on top of the die, finishing wire bonding, filling the holding frame with the fluorescent substance and covering the die to uniformly form a fluorescent layer, and finally packaging the whole body.

DETAILED DESCRIPTION OF THE INVENTION

Figure 1:
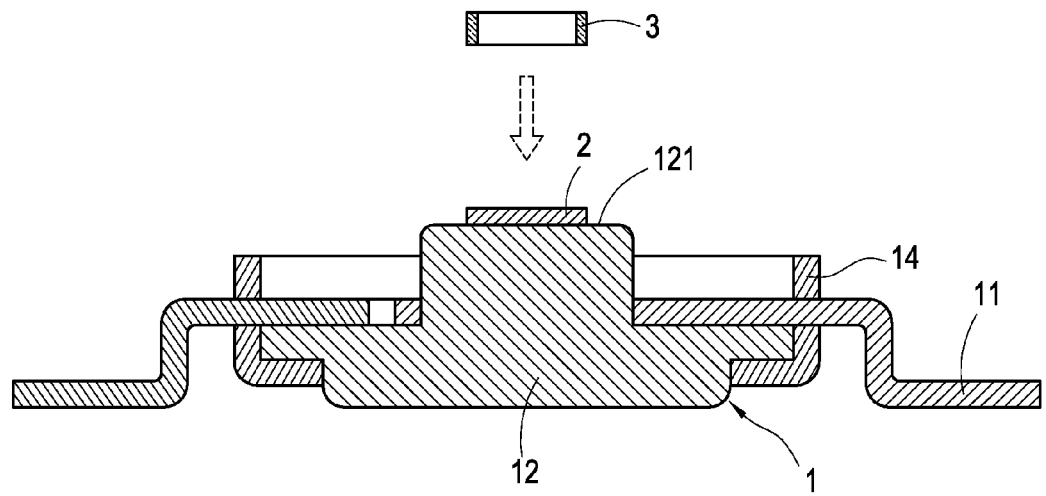
FIG. 1 is a cross-sectional view illustrating the first part of the process in fabricating the LED according to the present invention.

The drawings, FIG. 1 through FIG. 4, are cross-sectional views that show the preferred embodiment of the LED packaging process according to the present invention. Referring to FIG. 1, the LED structure according to the LED packaging process of the present invention comprises an LED substrate 1, an LED die 2, and a holding frame 3. The LED substrate 1 of the embodiment is a semi-finished frame-type LED, where the substrate 1 further comprises a frame 11 for providing electric conduction and a heat sink 12, and is encapsulated by the injected heat-resisting plastic to form an encapsulation 14. The heat sink 12 of the LED substrate 1 has a planar surface 121 that is devised for the LED die 2. The LED die 2 is capable of emitting blue light. A holding frame 3 is laid on the die 2 and attaches to the die 2 after the die 2 was bonded on top of the planar surface 121. The holding frame 3 is of hollow shape and embraces an area dimension smaller than the area of the die 2. The frame 3 is made of insulation material, which can also adopt the same material as the packaging substance such as silicone. The frame is made the same material as the packaging substance in the shown embodiment of the present invention.

Figure 2:
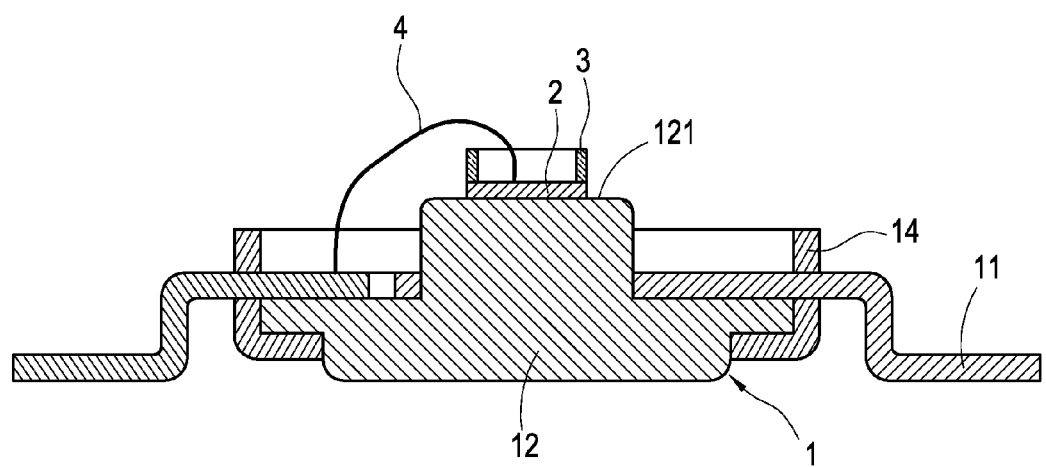
FIG. 2 is another cross-sectional view illustrating the process in fabricating the LED according to the present invention.
Figure 3:
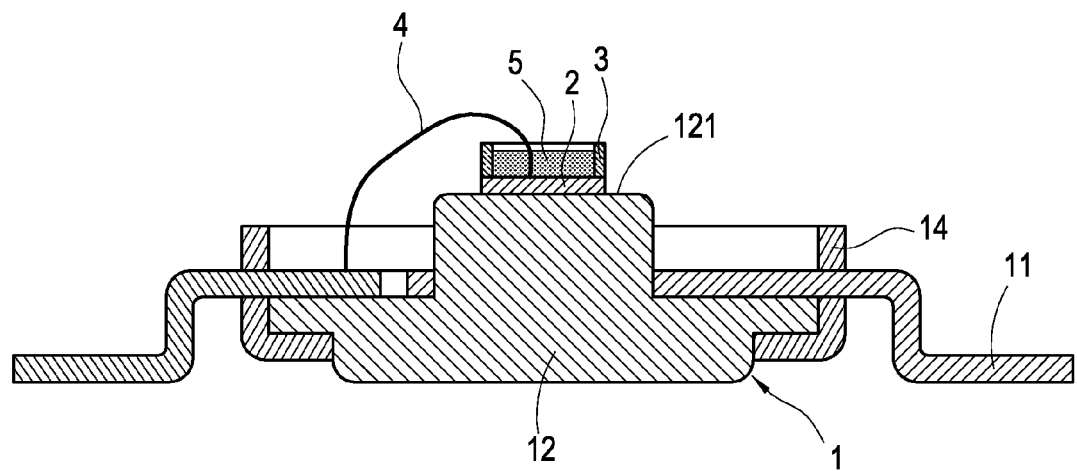
FIG. 3 is still another cross-sectional view illustrating the process in fabricating the LED according to the present invention.
Figure 4:
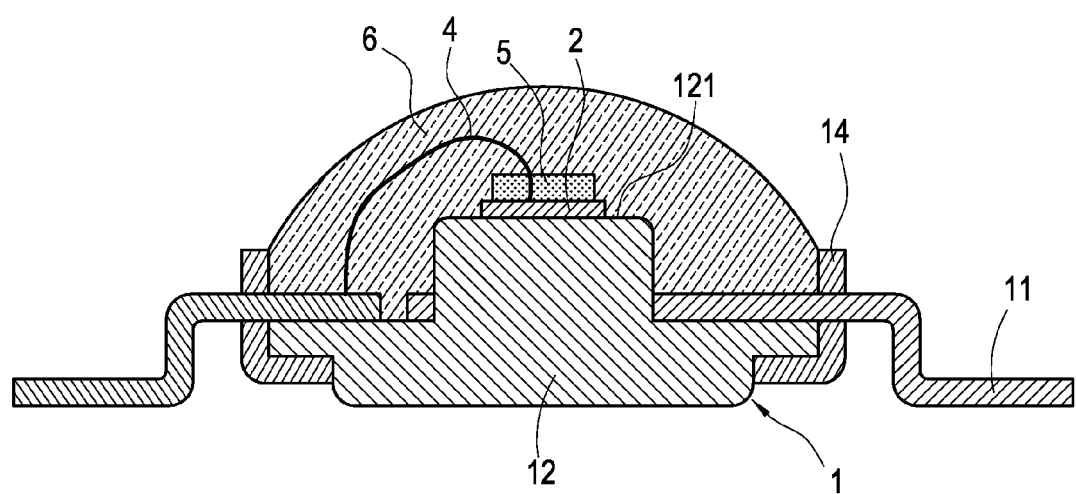
FIG. 4 is still another cross-sectional view illustrating the process in fabricating the LED according to the present invention.

Referring to FIG. 2, the holding frame 3 was mounted on top of the LED die 2, and then a conducting wire 4 is electrically connected to the frame 11 to form an electric conduction channel. By filling the holding frame 3 with the fluorescent substance and spreading the substance uniformly over the LED die 2, a fluorescent layer 5 is formed, as shown in FIG. 3, where the fluorescent substance is yellow phosphor. As the fluorescent substance forms a uniform fluorescent layer 5 on top of the die 2, the thickness of the layer is estimated from 20 up to 60 um. Once the packaging process forms a packaging housing 6 as shown in FIG. 4, the structure of the LED is accomplished. The holding frame 3 adopts the same material as that of the packaging housing 6, therefore, the holding frame 3 can be incorporated into the housing 6 without involving the step for mold release. During the operation of the LED, the blue light emitted by the LED die 2 could excite the fluorescent layer 5 on top of the die 2, that is formed by the fluorescent substance, to produce uniform white light. Moreover, if the holding frame 3 uses different material from the packaging housing 6, the holding frame 3 needs an extra step for the mold release, after the fluorescent layer 5 is formed on top of the die 2 by the fluorescent substance.

Figure 5:
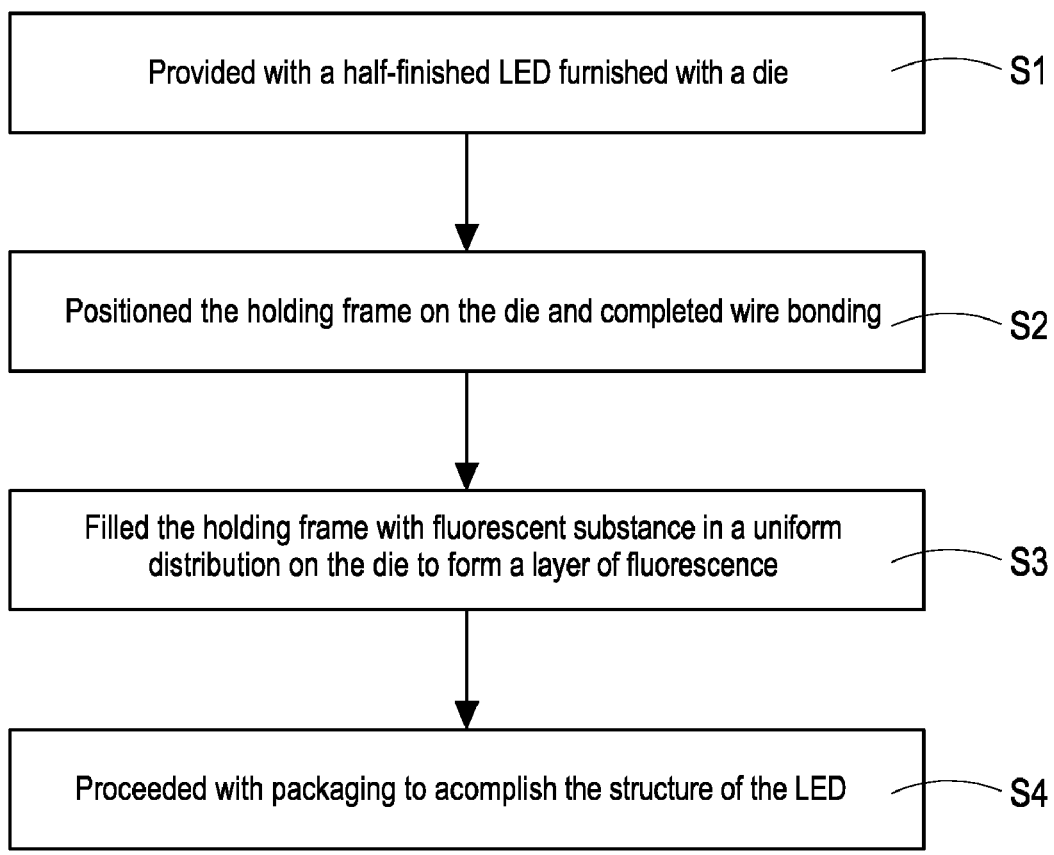
FIG. 5 is a flowchart showing the steps S1~S4 of the fabrication method of the present invention.

Referring to FIG. 5, it is a flowchart showing the steps of the packaging process: In step S1, an LED substrate 1, which is a semi-finished product mounted with an LED die is provided. In step S2, a holding frame 3 is placed on the LED die 2 and wire bonding is performed. In step S3, the holding frame 3 is filled with fluorescent substance uniformly on top of die 2 to form a uniform fluorescent layer 5. In step S4, the structure of the LED is accomplished once the packaging process is done.

Figure 6:
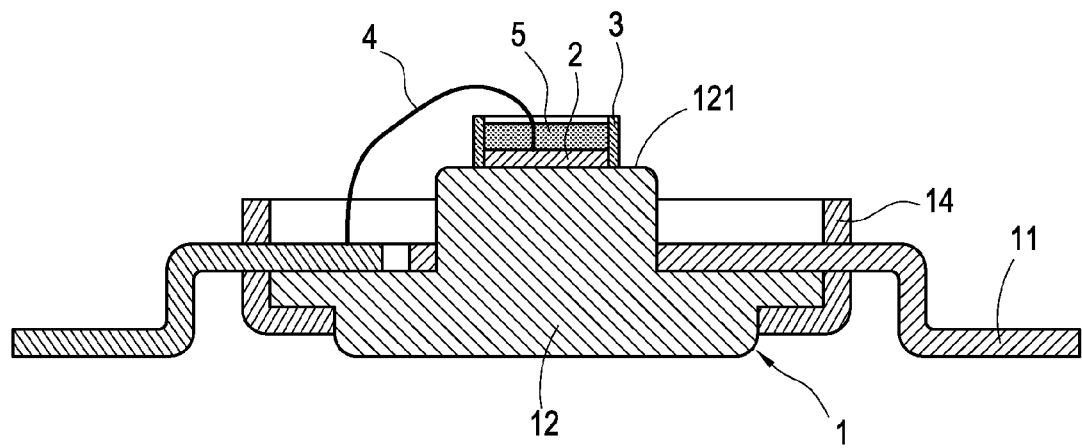
FIG. 6 shows the holding frame layout according to another embodiment of the present invention.

Beside foregoing layout on the die 2, the holding frame 3 can be placed around the die 2, as shown in FIG. 6, where the holding frame 3 and the die 2 are coplanar on a plane 121. The area embraced by the holding frame 3 is actually greater than or equal to the area of the LED die 2. By filling the holding frame 3 with the fluorescent substance and spreading the substance uniformly over the LED die 2, the uniform fluorescent layer 5 is formed, with a thickness between 20 and 60 um. The structure of the LED is accomplished once the packaging process is done.

Figure 7:
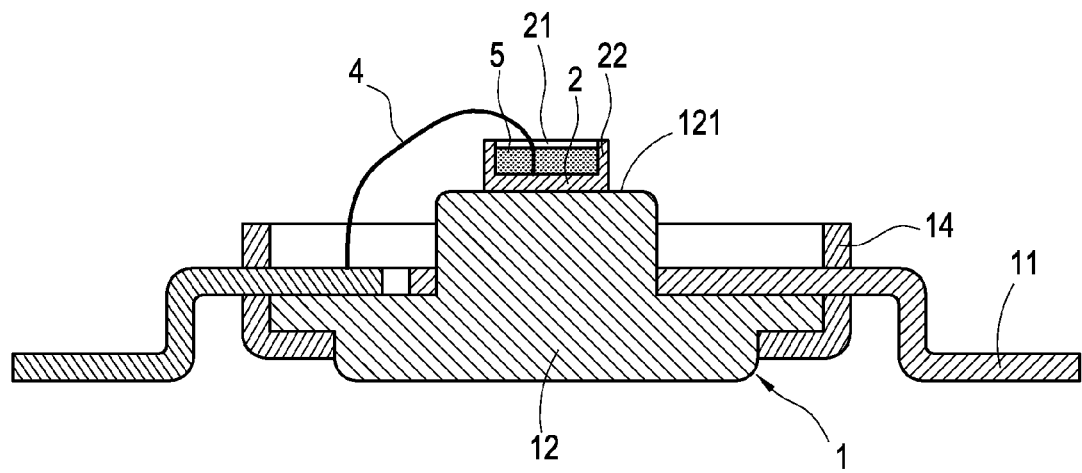
FIG. 7 is a cross-sectional view of the LED according to another embodiment of the present invention.
Figure 8:
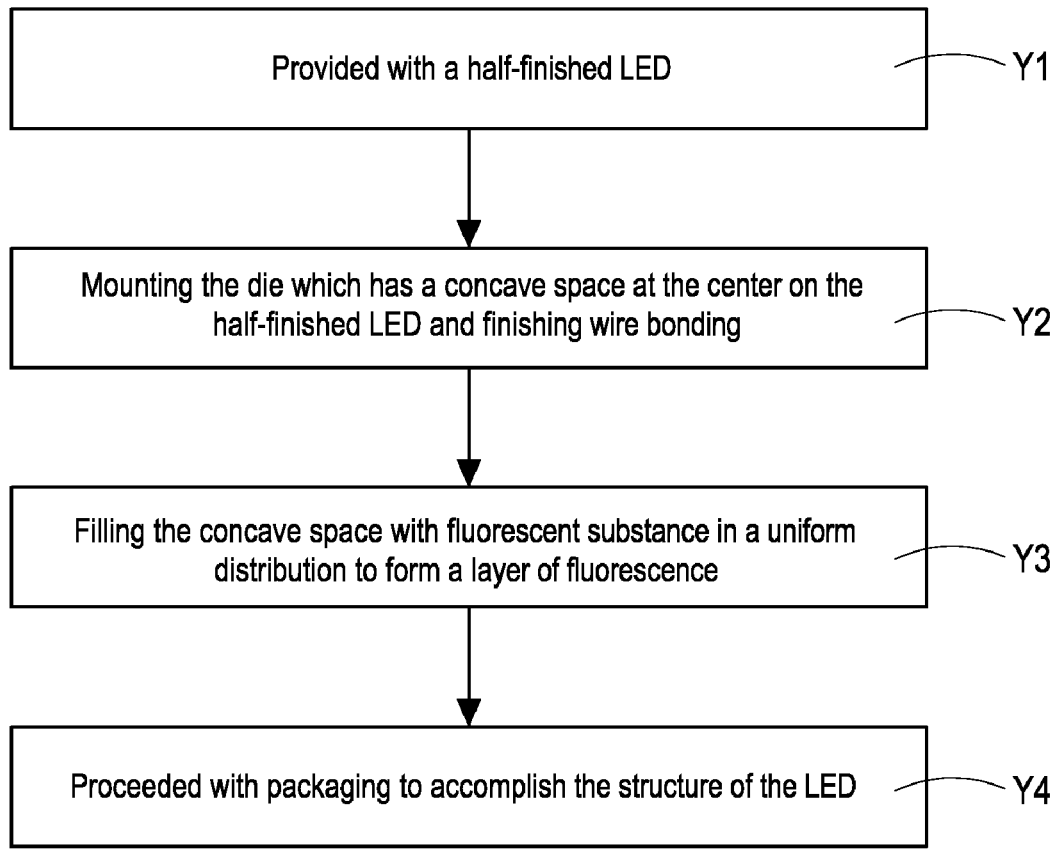
FIG. 8 is a flowchart showing the steps Y1~Y4 of the fabrication method according to another embodiment of the present invention.

Referring to FIG. 7 and FIG. 8, the two drawings show another preferred embodiment according to the present invention and the flowchart for the fabrication. The fabrication process starts with epitaxial growth on the LED die 2 to a certain thickness, follows by exploiting photolithography or etching to form uniform concave space 21 with a predetermined thickness such as 20 to 60 um at the center of the LED die 2. A wall 22 is formed around the rim of the die 2 where the concave space 21 is filled with the fluorescent substance to form a uniform fluorescent layer 5. Finally, a packaging step is performed to fulfill the structure. During the operation of the LED, the LED die 2 emits blue light to excite the fluorescent layer 5 formed on top of the die 2 by the fluorescent substance. Therefore, a uniform white light can be produced.

Figure 9:
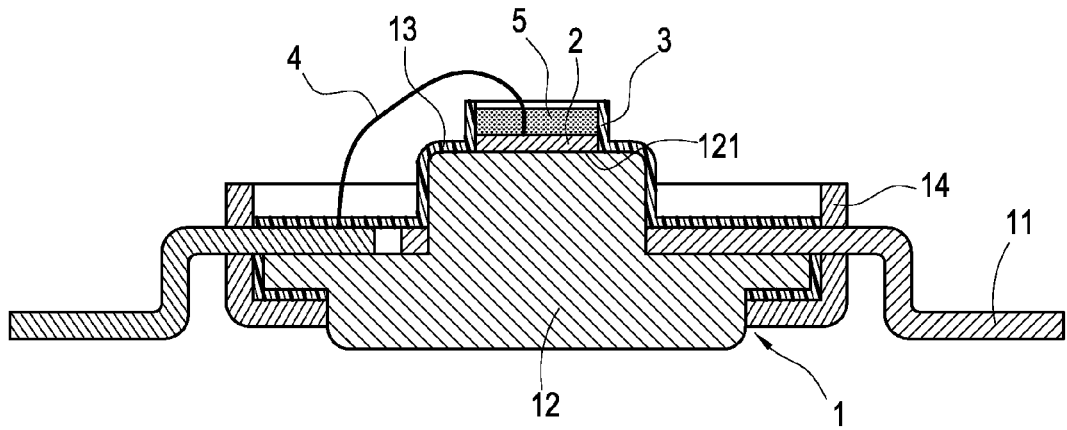
FIG. 9 is a cross-sectional view of the LED according to still another embodiment of the present invention.
Figure 10:
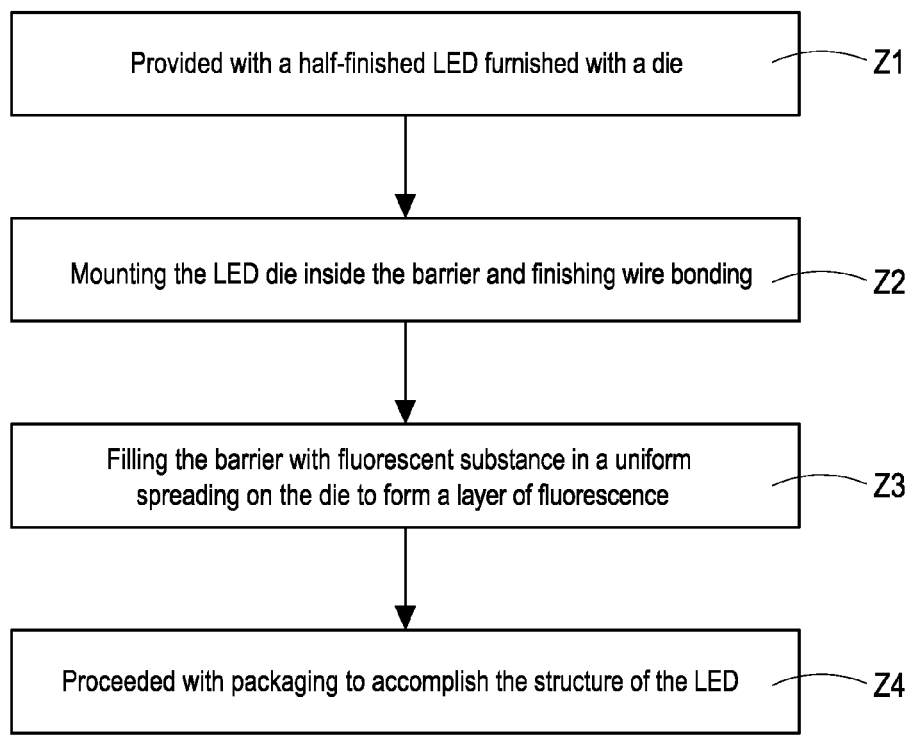
FIG. 10 is a flowchart showing the steps Z1~Z4 of a further embodiment of the fabrication method according to the present invention.

Referring to FIG. 9 and FIG. 10, the two drawings show a further embodiment according to the present invention and the flowchart for the fabrication. On the planar surface 121 of the LED die 2, a barrier 13 is formed by the injected heat-resisting plastic. The area of the planar surface 121 exposed from the barrier 13 is greater than or equal to the area of the LED die 2, and the height of the barrier 13 from the planar surface 121 is greater than the thickness of the LED die 2. By placing the LED die 2 on the planar surface 121 exposed from the barrier 13 and in the space embraced by the barrier 13, and filling the barrier 13 with the fluorescent substance and spreading the substance uniformly over the die 2, a uniform fluorescent layer 5 is formed with a thickness between 20 and 60 um and exposed from the barrier. The structure of the LED is accomplished once the packaging process is done. The LED die 2 emits blue light to excite the fluorescent layer 5 formed on top of the die 2 by the fluorescent substrate. Therefore, a uniform white light can be produced. produced.

While the foregoing description has been shown as the preferred embodiment, it shouldn't limit the scope of the present invention. Any variations and modifications which come within the meaning and range of the claims and contents of the application of the present invention are therefore intended to be embraced therein.

What is claimed is:

1. A light emitting diode (LED) structure, comprising:
   a substrate having a heat sink with a planar surface;
   a light emitting die, mounted on said planar surface of the heat sink, having a concave space located at center thereof and formed by etching a top portion of the light emitting die to a predetermined depth and to expose a light emitting face of the light emitting die, and a wall around the rim thereof, the wall extending from the light emitting die and being formed into one-piece with the light emitting die; and
   a fluorescent layer, being formed by filling the concave space with a fluorescent substance, uniformly covering the light emitting face of said light emitting die.

2. An LED structure as in claim 1, wherein said substrate is a semi-finished LED product, the substrate comprises a frame for providing electric conduction, and the substrate is encapsulated to form an encapsulation.

3. An LED structure as in claim 1, wherein said fluorescent layer has a thickness between 20 and 60 um.

4. A light emitting diode (LED) structure, comprising:
   a substrate, said substrate having a heat sink, the heat sink having an upwardly-projecting mesa with a planar surface;
   a barrier, formed by injecting heat-resisting plastic to cover the upwardly-projecting mesa and part of bottom face of the heat sink, the barrier further comprising upwardly-extended portion to define a hollow space therebetween;
   a light emitting die, mounted inside of said hollow space wherein the height of the upwardly-extended portion of the barrier is higher than that of the light emitting die; and
   a fluorescent layer, being formed by filling the hollow space with a fluorescent substance, covering top surface of said light emitting die, being exposed from the barrier.

5. An LED structure as in claim 4, wherein the substrate further comprises a frame for providing electric conduction, and the substrate is encapsulated to form an encapsulation extended at least from two lateral sides of the heat sink.

6. An LED structure as in claim 5, wherein the barrier is confined within the encapsulation.

7. An LED structure as in claim 4, wherein the planar surface is exposed from the barrier, the light emitting die is mounted on the planar surface exposed from the barrier so that the barrier embraces the light emitting die, said barrier has a height from the planar surface greater than the thickness of said die, the area of the planar surface exposed from the barrier is either greater than or equal to the area of the light emitting die.

8. An LED structure as in claim 4, wherein said fluorescent layer has a thickness between 20 and 60 um.

* * * * *